Jan. 23, 1973 H. DORENDORF 3,713,008

SEMICONDUCTOR DEVICES HAVING AT LEAST FOUR REGIONS OF ALTERNATELY DIFFERENT CONDUCTANCE TYPE

Original Filed Nov. 13, 1963

2 Sheets-Sheet 1

United States Patent Office 3,713,008
Patented Jan. 23, 1973

3,713,008

SEMICONDUCTOR DEVICES HAVING AT LEAST FOUR REGIONS OF ALTERNATELY DIFFERENT CONDUCTANCE TYPE

Heinz Dorendorf, Munich, Germany, assignor to Siemens Aktiengesellschaft, Berlin and Munich, Germany Original application Nov. 13, 1963, Ser. No. 323,280. Divided and this application May 8, 1967, Ser. No. 648,179
Claims priority, application Germany, Nov. 26, 1962, S 82,756
Int. Cl. H01l 19/00
U.S. Cl. 317—235 R 7 Claims

ABSTRACT OF THE DISCLOSURE

Described is a semiconductor device having at least four regions of alternately different conductance type and comprising a flat plate-shaped body of crystalline semiconductor material. The main portion of the body has a first type of conductance forming one flat surface of the plate. Two diffusion-doped surface regions of the opposed conductance type are located in the body at the other flat surface of the plate and cover respective surface areas of smaller size than, and positioned within, the other plate surface. These two regions forming respective p-n junctions with the main portion and being spaced from each other by part of the main portion a distance not larger than five times the median diffusion length of the minority charge carriers in the main portion. Another region, having the same conductance type as the main portion and having smaller dimensions than one of the two opposed-type conductance regions, located at the other plate surface and surrounded by one region to form a third p-n junction therewith. The shortest distance of the other region from the main portion being no larger than the median diffusion length of the minority charge carriers in the one region. The body may be silicon.

This is a division of my copending application Ser. No. 323,280, filed Nov. 13, 1963, now abandoned, and relates to four-layer diodes, dynistors, semiconductor controlled rectifiers, bilateral transistors and other semiconductor devices having four or more regions of alternately, different conductance type. By virtue of a negative resistance range in their current-voltage characteristic, such devices are applicable for various electronic switching or triggering operations.

It is known to produce transistors of this kind by employing a gas-diffusion process. A dopant substance, applied in the gaseous phase, is caused to diffuse into the material of a heated semiconductor carrier crystal of a given conductance type, thus producing at least two additional regions of different conductance type at the surface of the carrier crystal. Such a process is described for example in Proceedings of the I.R.E., 1956, pages 1174 to 1182. The method is suitable for the production of pnpn (or npnp) semiconductor bodies.

It is also known to produce junction transistors by the so-called planar technique of which an example is described in U.S. Pat. 3,025,589. The process requires coating the semiconductor crystalline carrier with a thin surface layer consisting at least partially of silicon dioxide ($SiO_2$) before performing the diffusion-doping process. After doping a region for the conductance type opposed to that of the carrier crystal, the marginal portions of this region are covered by another $SiO_2$ layer. Thereafter an activator or dopant is diffused into the exposed surface portion of this region in such a manner that the newly doped region resulting from the second diffusion process is nowhere in contact with the portion of the carrier crystal that has remained undisturbed by the diffusion processes and thus has retained its original type of conductance.

It is an object of my invention to afford applying a planar technique for the production of semiconductor devices having at least four regions of respectively different conductance type.

Another object of the invention, subsidiary to the one mentioned above, is to obtain a four-layer or multi-layer device by a planar technique in which all of the individual layers are well accessible and readily contactable and in which further the individual regions of respectively different or alternating conductance type have electrodes extending all toward the same side of the semiconductor crystal.

Still another object of my invention is to devise a method particularly well suitable for the simultaneous production of a large number of individual four-layer semiconductor devices, and also the production of multi-component devices all having a single semiconductor carrier crystal in a microelectronic system.

It is also an object of my invention, akin to those already mentioned, to devise an economical mass production method of making four-layer semiconductor switches and controlled rectifiers of monocrystalline silicon particularly well suitable for various electronic switching, triggering or data-storing operations.

According to my invention, semiconductor devices with at least four regions of alternately different conductance types are produced as follows. Used as starting material is a crystalline semiconductor body, such as a plate or wafer, of a given, first conductance type. The surface of this semiconductor crystal is coated with an insulating layer consisting preferably of silicon dioxide ($SiO_2$), and two window openings are provided in the coating in closely spaced relation to each other, each opening thus exposing a limited surface area of the semiconductor crystal. Then the exposed surface areas in the two openings are subjected to diffusion by a dopant, supplied in the gaseous state, that causes in the crystal the type of conductance opposed to that of the original semiconductor material. This produces in the crystal two adjacent but mutually spaced surface regions of the opposed, second conductance type, each forming a p-n junction with the undisturbed portion of the semiconductor crystal, which thus will constitute a third active region between the two junctions when the device is subsequently completed. Thereafter, in another processing step, a different dopant substance is entered by diffusion or alloying into an area portion within the surface area of at least one of the above-mentioned two opposingly doped regions, thus producing a fourth region which has the same type of conductance as the undisturbed portion of the semiconductor crystal and is surrounded by the opposingly doped region. The diffusion or alloying is carried out to a smaller depth than the preceding diffusion so that the minimum distance of the previously produced diffusion zone from the undisturbed crystal material neither vanishes nor exceeds the diffusion length of the minority charge carriers in the surrounding region of the opposed conductance type, whereas the above-mentioned distance between the openings in the $SiO_2$ coating and consequently the shortest distance between the two opposingly doped regions is at most equal to five times the median diffusion length of the minority charge carriers in the undisturbed semiconductor material. For example, in a preferred form of the invention with a semiconductor body of n-type silicon, this shortest distance between the opposingly doped, p-type regions and hence between the two p-n junctions which these regions form with the undisturbed n-type silicon, is between 10 and 200$\mu$, preferably about 50$\mu$; and the distance between the fourth region and the undisturbed silicon portion may be kept between 1 and 4$\mu$, preferably 1 to 2$\mu$.

The above-mentioned and further objects, advantages, and features of my invention, said features being set forth with particularity in the claims annexed hereto, will be apparent from, and will be described in, the following with reference to embodiments of processes and devices according to the invention described presently by way of example in conjunction with the accompanying drawings in which:

All illustrations are on greatly enlarged scale.

Figure 1:
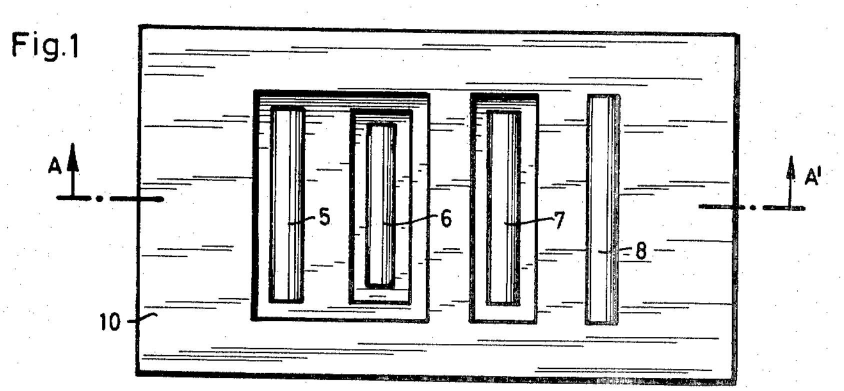
FIG. 1 is a plan view of a pnpn switching diode.
Figures 2, 2A, 3:
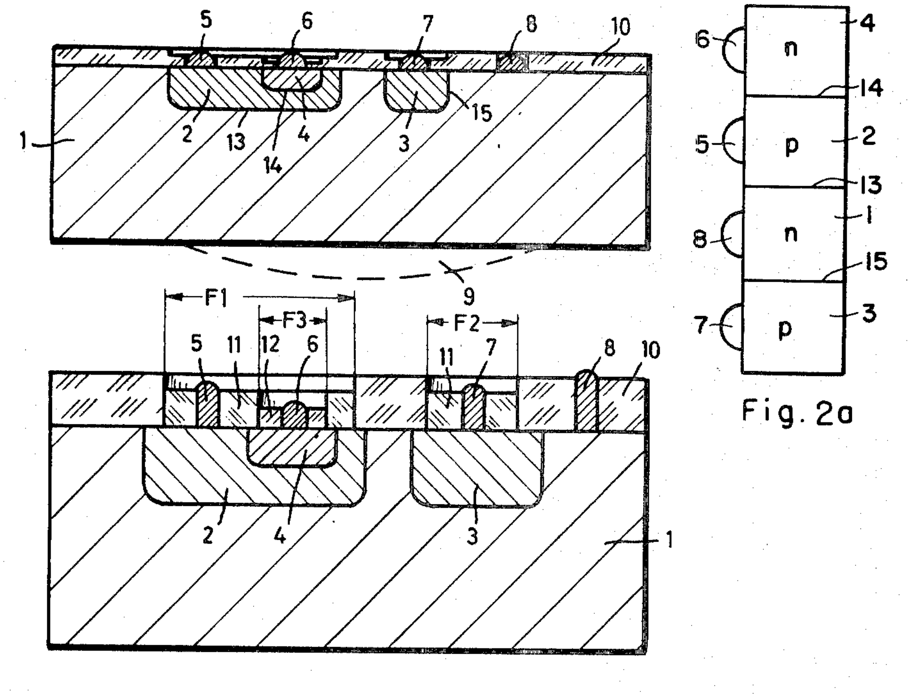
FIG. 2 is a cross section along the line A–A′ in FIG. 1.
FIG. 2*a* is an explanatory schematic diagram relating to the layer sequence in the same device.
FIG. 3 is a different presentation of the same diode in a cross-sectional view similar to that in FIG. 2 but modified for the purpose of explaining an example of a production process according to the invention.

The semiconductor device shown in FIGS. 1 and 2 constitutes a four-layer pnpn switching diode produced by the method according to the invention. The original semiconductor body of which the device is made, and which still constitutes the main portion of the semiconductor material consists of a flat plate or wafer 1 of monocrystalline silicon having n-type conductance whose specific resistance at 20° C. is about 0.1 to 100 ohm cm. By employing the known masking technique with the aid of a coating of silicon oxide $SiO_2$, two small p-type regions 2 and 3 of about 4$\mu$ thickness are diffused into the top surface of the silicon wafer. Also by means of the $SiO_2$-masking process, an n-type region 4 of about 3$\mu$ thickness is diffused into the region 2. The sequence of these regions and of the resulting p-n junctions is apparent from FIG. 2*a*.

Ohmic contacts 5, 6, 7 and 8, deposited by vaporization, are alloyed into the respective regions. Contact 5 is thus joined with the p-type region 2, contact 6 with the n-type region 4, contact 7 with the p-type region 3, and contact 8 is alloy-bonded with the undisturbed n-type portion 1 of the silicon crystal. The original crystal 1 may also be contacted on the opposite side over a large area by a contact member 9 shown by a broken line (FIG. 2). Denoted by 10 is the insulating layer of $SiO_2$ employed for the masking operations. The regions 2 and 4 form together with the undisturbed portion of the silicon crystal a normal planar transistor in which the region 2 constitutes the base and the region 4 the emitter. Due to the presence of the additional region 3, the device is a four-layer device which, if the mutual spacing between the individual regions 2, 3 and 4, particularly between regions 2 and 3, is sufficiently small, possesses a current-voltage characteristic suitable for use as an electronic switch to perform various switching, triggering, pulse generating, and oscillation generating operations in the known manner.

One way of producing the above-described four-layer diode according to the invention is as follows:

The semiconductor crystal of monocrystalline silicon having for example the above-mentioned type of conductance is first subjected in the conventional manner to surface cleaning and to elimination of surface disturbances such as crystal imperfections, oxide spots, soiling and the like. Then the top surface of the crystal is provided with an insulating coating of $SiO_2$, about 0.3 to 2$\mu$ thick, which leaves only two window openings F1, F2 (FIG. 3) exposed at which the semiconductor crystal is to be subsequently subjected to diffusion.

The $SiO_2$ layer can be produced, for example, by vaporizing SiO onto the surface and subsequently oxidizing the deposition to $SiO_2$. This method is applicable to any semiconductor material. However, when the semiconductor material consists of silicon or silicon carbide, it is more convenient to directly oxidize the crystal surface to obtain the desired oxide masking layer. This is preferably done by heating the crystal in an atmosphere of oxygen and steam. Also applicable for this purpose is heating of the crystal in pure oxygen or in pure steam. If desired, the surface oxidation may also be effected by anodic electrolysis. Relative to details of the oxidation process reference may be had to the pertinent literature, for example "The Bell System Technical Journal," 1959, vol. 38, No. 3, pages 749 to 783 (M. M. Atala, E. J. Schreibner, "Stabilisation of Silicon Surfaces by Thermally Grown Oxides.")

The window openings F1, F2 required for the diffusion treatment are preferably produced upon completion of the oxidation with the aid of an etching agent. The environment around the locations to be etched is preferably protected from the etchant by masking. It is advisable to do this by means of the known photolithographic or photoresistance method, employing a varnish layer which in the exposed and photographically developed condition affords sufficient protection from attack by the etchant, whereas the unexposed varnish layer is removed by the photographic developing and rinsing with water. For producing the window openings F1 and F2, the oxide surface around the window areas is to be masked-off with exposed photovarnish. The individual steps of the method according to the invention will be further explained with reference to FIG. 3.

PROCESS STEP A

The purpose of the first method step is to provide the semiconductor crystal, consisting of n-type silicon in the chosen example, with a coating of $SiO_2$ which leaves the semiconductor surface bare only through the window openings F1 and F2. Accordingly, FIG. 3 shows the semiconductor body 1 coated with an $SiO_2$ layer 10 as applied during the first process step A. The coating is removed at the localities of the two window openings F1, F2 and forms the mask for the diffusion process applied by the following process step B.

PROCESS STEP B

In the second process step, an activator or dopant in gaseous condition is contacted with the heated semiconductor surface for producing a surface region of a conductance type opposed to that of the original semiconductor material. The activator is preferably so chosen that its diffusion rate in the $SiO_2$ layer is negligible in comparison with that in the semiconductor, so that the $SiO_2$ layer constitutes a barrier for the activator. This is the case for example with respect to the acceptor boron. For that reason, when employing a semiconductor body of n-type silicon (the same applies also to n-type germanium or silicon carbide), boron is among the acceptor substances preferably used for diffusion into the semiconductor crystal in order to produce the regions 2 and 3 of the opposed conductance type. A favorable way of doing this is to temper the $SiO_2$-coated crystal 1 at a temperature of 900° to 1200° C. for about 30 minutes or more in an atmosphere of argon, helium or nitrogen that contains admixed boric-acid vapor or boron-trioxide vapor. Also suitable as an addition to the inert carrier gas is boron-halogenide vapor. Thereafter the processing gas is switched to an oxygen- or steam-containing atmosphere so that the semi-conductor area within the window openings F1 and F2 is oxidized. This results in the formation of the oxide coating denoted by 11 in FIG. 3, these coatings being somewhat thinner than the $SiO_2$ layer 10.

When employing acceptors other than boron, the diffusion is preferably performed at a temperature above 900° C., particularly in the vicinity of 1200° C. The desired diffusion depth is preferably 3 to 10$\mu$, particularly 4$\mu$. These values apply to a crystalline carrier body of n-type silicon.

If the starting crystal has p-type conductance, the first diffusion regions 2 and 3 must possess n-type conductance. The diffusion is then performed for example with phosphorus-pentoxide vapor or phosphorus-trioxide vapor. In this respect, reference may be had to the particularly mentioned below in the description of process step D.

PROCESS STEP C

In this process step a hole F3 of smaller area is etched into the newly formed oxide coatings within one of the two window openings F1, F2. In the present example, the hole F3 is etched into the area of the opening F1. The oxide coating at the other window opening F2 is not removed. For exactly limiting the area of the new opening F3 it is preferable to repeat the application of the photolithographic process mentioned above in conjunction with process step A.

PROCESS STEP D

This fourth step consists in diffusing into the crystal an activator that produces the conductance type of the original crystal, now employing the opening F3, while the surrounding surface is masked off. For this diffusion step, too, it is advisable, when employing silicon and silicon carbide, to apply a doping atmosphere that possesses oxidizing properties. This has the result, as indicated in FIG. 3, of again forming an $SiO_2$ coating in opening F3 without preventing the diffusion of the activator into the crystal. In the example here being described, the doping of the n-type crystal through opening F3 is effected by employing phosphorus-pentoxide vapor or phosphorus-trioxide vapor in the same manner as described for step B. Upon completion of step D, a region 4 of the same conductance type as the supporting crystal has been formed within the opposingly doped region 2, and has been coated by an oxide layer 12.

PROCESS STEP E

It remains necessary to apply contacts at least to the two outer regions 4 and 3 of the pnpn or npnp crystal. To this end, it is preferable to alloy ohmic contact materials into the crystal. This requires previously removing the $SiO_2$ coatings at the intended localities of contact. These localities are kept as small as feasible. The oxide layer is preferably removed by etching, for example by means of the conventional hydrofluoric-acid etchants. Preferable as contacting material for p-type regions is aluminum. The n-type regions are preferably contacted by gold which contains small amounts of antimony, or also by aluminum. After etching those opening into the oxide layer as are required for contacting purposes, the contacts 5, 6, 7 or 8 are deposited by vaporizing them onto the crystal, and the depositions are thereafter alloyed into the crystal by heating in the conventional manner.

A barrier-free contacting of n-type regions, using aluminum as contact material, is possible if the end regions are highly doped at least at the contacting location and the temperature at which the aluminum is alloyed into the crystal is kept so low that only little aluminum becomes dissolved in the resulting molten alloy. In this case, the solidifying semiconducting material crystallizing out of the melt will throughout contain n-type dopant (donor) atoms, such as phosphorus, in an excessive amount so that no p-n junction is formed and the solidified aluminum will form an ohmic contact with the crystal. To achieve this in the case of the example here being described, the alloying temperature must be adjusted to approximately 600° C. If the n-types carrier material 1 of the crystal has a relatively low dopant concentration and the contact 8 or 9 is to be made of aluminum, it is advisable to effect a pre-diffusion with the activator employed for producing the emitter region 4, this pre-diffusion being carried out during process step D at the locality where the contact 8 or 9 is to be subsequently attached.

It is desirable to aim at obtaining a surface concentration $C_0$ of $5.10^{17}$ to $10^{19}$ acceptor atoms/cm.$^3$ at the surface of the p-type region 2, whereas the n-type region 4 is to have a donor surface concentration $C_0$ of about $10^{19}$ to $10^{21}$ donor atoms/cm.$^3$. Under such conditions, a pre-diffusion at the locality of the contact 8 by the donor atoms, occurring simultaneously with the production of the region 4, furnishes a concentration of donor atoms sufficient for the subsequent use of an aluminum contact 8 to contact the undisturbed portion of the carrier crystal 1.

The region 4 may also be produced by an alloying process. This has the advantage that the same alloying process simultaneously provides for the metallic contacting of this region. However, since with respect to uniformity the p-n junctions produced by alloying are inferior to those produced by diffusion, and also for other reason peculiar to planar techniques, it is preferable to forego this advantage of alloying and produce the zone 4 by diffusion as described above.

For employing a four-layer (pnpn or npnp) semiconductor diode for switching or triggering operations it is only necessary to provide contacts at the two "outer" regions 3 and 4. In many cases, however, it is desirable to also provide for contacting of the other regions, for example in the manner apparent from FIGS. 1 and 2. The metal electrodes 5 to 9 produced by the contacting process are suitable for attachment of electric wires. Preferable for such attachment is the known method of thermo-compression according to which contacting wires, moderately heated, are being pressed by suitable edges, blades or points of pressure tools against the metal surface, thus permanently joining the wires with that surface.

Figure 4:
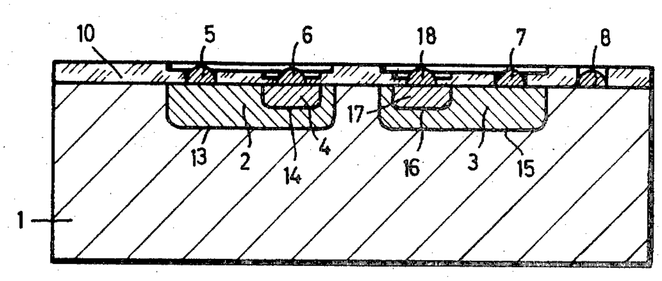
FIG. 4 is a cross-sectional view similar to FIG. 2 but showing a five-layer semiconductor device.

The process according to the invention described in the foregoing is essentially also applicable for the production of semiconductor bodies and devices having five layers or regions of alternately different conductance type, as exemplified by the device shown in FIG. 4. The reference characters applied in FIG. 4 correspond essentially to those in FIGS. 1 to 3 for comparable items respectively. In addition to the regions 2, 3 and 4 with the corresponding p-n junctions 13, 14 and 15 of a device as described above, the one shown in FIG. 4 is provided with a region 17 that forms a p-n junction 16 and possesses the same conductance type as the undisturbed portion of the carrier crystal 1. The region 17 is located within the region 3. With respect to the dimensioning and doping of region 17, the foregoing description and explanation concerning the region 4 is applicable. It is preferable to arrange the regions 4 and 16 in mirror-symmetrical relation to each other, this being shown in FIG. 4. The production of the two regions 4 and 17 is effected in a single process step. Used for contacting the region 17 is a metal contact 18 of the same material as the metal contact 6.

The method according to the invention for producing a semiconductor device having at least four regions of alternately different conductance type can be modified and enlarged upon in various ways. For example, a semiconductor device or component can be provided in this manner with any desired multiplicity of regions having alternately different conductance type. Furthermore, the method of the invention may also be employed to advantage by producing on a single semiconductor plate or wafer a large number of components of the type described, within a single course of production. For example, by applying a corresponding masking technique, many hundred pairs of regions 2 and 3 can thus be made during a single, simultaneous diffusion stage of the process, and the appertaining regions 4 and 17 can be produced conjointly during a second diffusion stage. Analogously, when applying corresponding masks by photolithography, the etching treatment for producing the required contacts can be carried out for many hundreds of components within a single process step, and the same can be done respectively for the vapor-deposition and alloy-bonding of the metal contacts. Thereafter the electric wires can be joined in the above-described manner with the electrodes by means of thermo-compression, prior to separating the single crystalline carrier plate or wafer into individual semiconductor components, for example, by scoring and breaking.

Such a subdivision of the semiconductor wafer, however, is dispensed with in those cases where it is desired to retain a number of individual semiconductor components on a common carrier crystal, for example in composite circuit arrangements where a mutual influence of the semiconductor components produced on the common crystal is either desired or is prevented by suitable expedients. Such a prevention of undesired interaction is obtained by the provision of "isolating" p-n junctions as exemplified in the device illustrated in FIGS. 5 to 7 and described hereinafter. Isolating p-n junctions are employed particularly in compound circuitry of semiconductor components that combine a plurality of functions within a single device. Examples of this kind are pnpn switching diodes in connection with other active circuit components such as transistors, rectifier diodes, resistors and capacitors, which are all accommodated in a single, continuous semiconductor body according to the principles of "semiconductor solid-state circuitry" or "microelectronics" (reference in this respect may be had, for example, to the book Microelecrtonics edited by E. Keonjian, published by McGraw-Hill Book Co., New York, 1963).

Figure 5:
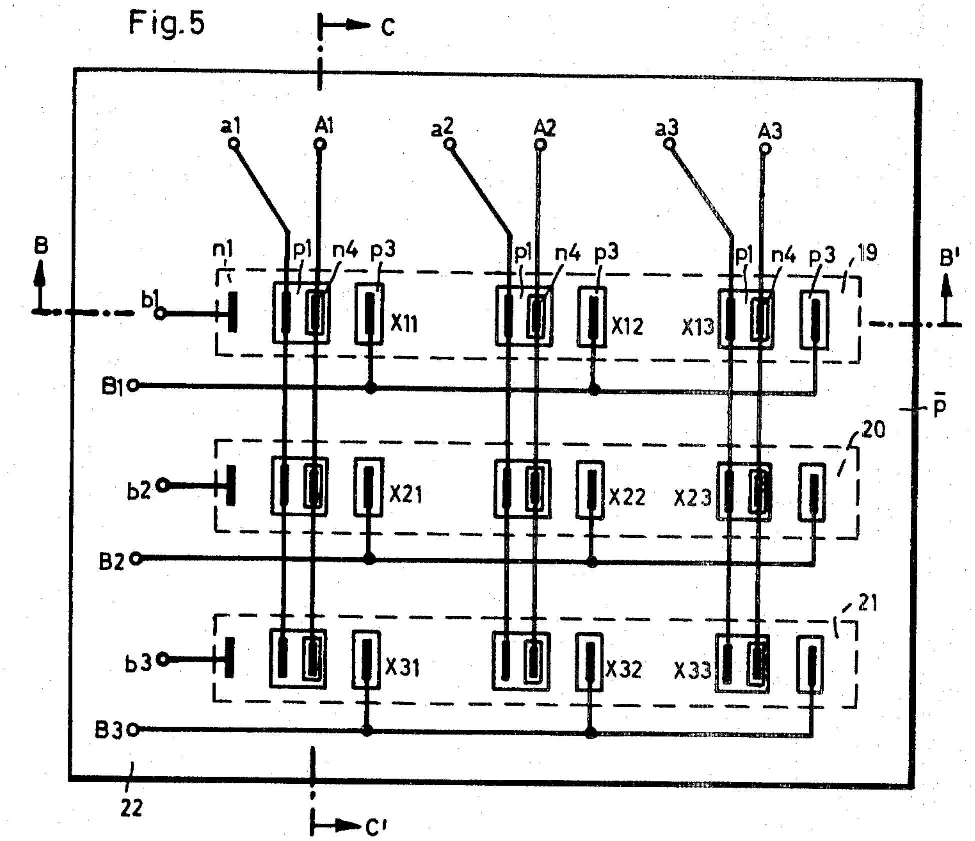
FIG. 5 is a plan view of a semiconductor integrated circuit according to the invention, comprising a combination of semiconductor solid-state elements on a continuous semiconductor body.
Figure 6:
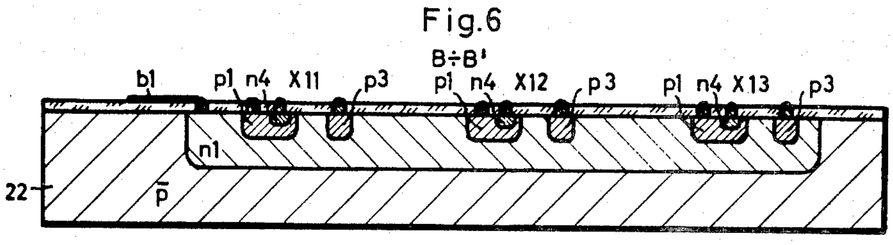
FIG. 6 is a cross section along the line B–B′.
Figure 7:
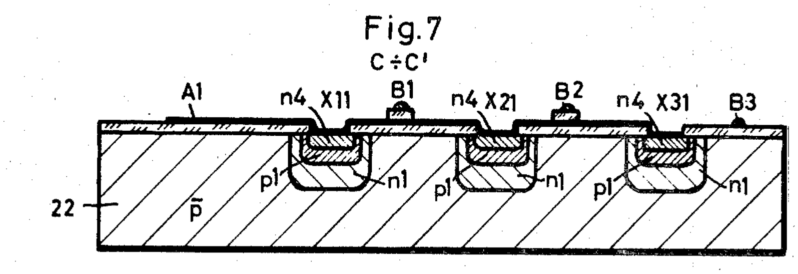
FIG. 7 is a cross section along the line C–C′ in FIG. 5.

The microelectronic device shown in FIGS. 5 to 7 comprises 3 x 3 four-layers devices in a single semiconductor crystal 22 and is applicable for example in cross-bar systems for selective switching or memory purposes.

A p-type silicon monocrystal 22 comprises three large n-type regions $n_1$ produced by diffusion, the original p-type silicon material being denoted by $\overline{p}$. The n-type regions $n_1$ are diffused down to a relatively large depth (10 to 50$\mu$) and have a low surface concentration of the dopant atoms. Four-layer units $X_{ik}$ ($i$, $k$=1 to 3) are diffused into three of the n-type regions $n_1$ in the manner described above. Conducting paths of aluminum are vapor-deposited upon the $SiO_2$ layer employed for masking and connect the corresponding electrode contacts with one another. Thus a conducting aluminum path $A_i$ connects all vertical emitters. A path or lead $B_i$ connects all horizontal emitters. Aluminum lead $a_i$ connects all vertical base contacts, and aluminum lead $b_i$ connects the first, deep diffusion regions.

Denoted in FIGS. 5 to 7 by $p_1$ are the diffusion regions corresponding to the regions 2 in FIGS. 1 to 4; denoted by $p_3$ are the regions corresponding to regions 3, and denoted by $n_4$ are the regions 4 of FIGS. 1 to 4, the metal contacts and the $SiO_2$ layers are not designated by reference characters in FIGS. 5 to 7. The p-n junction between the p-conducting starting material $\overline{p}$ in the silicon crystal 22 and the first-diffused n-regions $n_1$ isolates the individual system units from one another.

If a low-ohmic connection is to be made, for example between $B_2$ and $A_1$, a direct voltage is applied to both electrodes through an RC-member. This voltage is so rated that the four-layer unit $X_{21}$ does not yet trigger. Hence, unit $X_{21}$ can be triggered by applying a pulse to $a_1$ and/or $b_2$. After cessation of the ignition pulse, the unit $X_{21}$ remains turned on until the direct voltage between $A_1$ and $B_2$ is switched off or until $a_1$ and/or $b_2$ receive pulses of the opposite polarity. The connection between $A_1$ and $B_2$ also comes about if $A_1$ and all $B_i$'s are under voltage. If the ignition pulse is applied only to $b_2$, or to $b_2$ and $a_1$, unit $X_{21}$ will trigger only in the forward direction. When all $A_i$'s and all $B_i$'s are under voltage, the ignition of $X_{21}$ can take place only when ignition pulses are simultaneously applied to $a_1$ and $b_2$. The voltages are so rated that in this case only $X_{21}$ can trigger. The RC-members connected in series with the electrodes may also be accommodated in the semiconductor crystal in the known manner. Furthermore, by suitable choice of the geometry in each four-layer unit, internal path resistances can be connected in series with the ignition electrodes.

Mutual contact between the vapor-deposited connecting leads at the points of intersection is prevented by interposed vapor deposition of SiO. However, if desired, one of the two intersecting leads may be passed through the crystal along the short distance where the intersection takes place, and this embedded portion can then be isolated by a p-n junction from the other portion of the crystal body.

The microelectronic device according to FIG. 5 is also applicable as an electronic memory. For this purpose all $A_i$ and $B_i$ leads are placed under voltage through series resistances. This voltage is so rated that the four-layer units do not yet trigger. If now in element $X_{ik}$ a digit "1" is to be stored, respective small pulses are applied to $b_i$ and $a_k$, so that only $X_{ik}$ will trigger. For extinguishing the unit, respective pulses of the opposite polarity are simultaneously applied to $b_i$ and $a_k$. For reading-out operation, that is, when it is desired to ascertain whether the element $X_{ki}$ contains the digit value "1," an extinguishing pulse is applied to $b_k$ and $a_i$. If element $X_{ki}$ was in conducting condition, this element now is turned off. This switching operation produces an abrupt change in potential applied to the entire device which can be coupled off the device capacitively.

To those skilled in the art it will be obvious upon a study of this disclosure that my invention permits of various modifications and may be applied to devices other than those particularly illustrated and described herein, without departing from the essential features of my invention and within the scope of the claims annexed hereto.

I claim:

1. In a PNPN semiconductor controlled switch, a body of semiconductor material having opposed major faces, a series of four active regions in said body extending to one major face of said body, adjacent regions of said series being of opposite conductivity type and forming three respective PN junctions which terminate entirely at said one major face of said body, an insulating layer on said one major face covering the entirety of the intersection of each of said junctions with said one major face, at least two of said four regions having the same dimension measured perpendicularly to said one major face respective electrical contacts located in openings in said insulating layer and extending to each of said four regions, each set of three adjacent regions of said series constituting an analog transistor of which the middle region of the set serves as the base as well as the collector of the analog transistor constituted by the other set.

2. The semiconductor switch of claim 1 having at least four regions of alternately different conductance type and comprising a flat plate-shaped body of crystalline semiconductor material whose main portion has a first type of conductance forming one flat surface of the plate; two diffusion-doped surface regions of the opposed conductance type located in said body at a second flat surface of the plate and covering respective surface areas of smaller size than, and positioned within, said second plate surface, said two regions forming respective p-n junctions with said main portion and being spaced from each other by part of said main portion of distance not larger than five times the medium diffusion length of the minority charge carriers in said main portion; and another region having the same conductance type as said main portion and having smaller dimensions than one of said two opposed conductance type regions, said other region being located at said second plate surface and surrounded by said one region to form a third p-n junction therewith, the shortest distance of said other region from said main portion being no larger than the medium diffusion length of the minority charge carriers in said one region.

3. The semiconductor switch of claim 1 having at least four regions of alternately different conductance type and comprising a flat plate-shaped body of monocrystalline silicon whose main portion has n-type conductance and 0.1 to 1,000 ohm cm. specific resistance, said main portion forming one of the two flat surfaces of the plate;

two diffusion-doped regions of p-type conductance located in said body at the other flat surface of the plate and covering respective surface areas of smaller size than, and surrounded by, said other plate surface, said two regions forming respective p-n- junctions with said main portion and being 10 to 200 microns spaced from each other; and an n-type region of smaller dimensions than one of said p-type regions, said n-type region being located at said other plate surface and surrounded by said one p-type region to form a third p-n- junction therewith, the shortest distance of said third junction from said p-n junction of said one p-type region with said main portion being 1 to 4 microns.

4. In a PNPNP or NPNPN semiconductor controlled switch, a body of semiconductor material having opposed major faces, a series of five active regions in said body extending to one major face of said body, adjacent regions of said series being of opposite conductivity types and forming four respective PN junctions which terminate entirely at said one major face of said body, an insulating layer on said one major face covering the entirety of the intersection of each said junctions with one major face, two non-adjacent regions of said series having both a first value and two other non-adjacent regions of said series having both a second value of the dimension measured perpendicularly to said one major face, respective electrical contacts located in openings in said insulating layer and extending to each of said five regions, these five regions constituting three analog transistors, each analog transistor consisting of a set of three adjacent regions, the middle region of each set simultaneously serving as the base of one of the analog transistors and at least one of the collector and the emitter of another of these analog transistors.

5. In a two dimensional semiconductor switching device, a body of semiconductor material having opposed major faces, a multiplicity of series of four active regions in said body extending to the major face of said body, adjacent regions of said series being of opposite conductivity types and forming three respective PN junctions which terminate entirely at said one major face of said body, at least two regions of each series of four active regions in said body having the same dimension measured perpendicularly to said one major face, respective electrical contacts located in openings in said insulating layer and extending to each of said four regions, each set of three adjacent regions of each series of four active regions constituting an analog transistor of which the middle region of the set serves as the base as well as the collector of the analog transistor constituted by the other set, each series of four active regions in said body of semiconductor material constituting one PNPN switch element having two outer regions and two central regions, these PNPN switch elements being arranged according to a pattern of parallel lines and columns at said major face of said semiconductor body, a system of mutually insulated electrical leads fastened on said insulating layer one part of the leads of which extends parallel to the lines, another part parallel to the columns of said pattern of PNPN switch elements, each outer region of each PNPN switch element being connected only to one of these leads, each one lead being allotted only to one of the lines or columns of said pattern and each of the lines or columns being allotted to one of the leads, this allotment being effected by the connection of the respective lead to one of the outer regions of the PNPN switch elements arranged in that respective line or column of said pattern.

6. The two dimensional semiconductor switching device of claim 5, wherein one of the central regions of the PNPN switching element arranged in each of the lines of the arrangement pattern is common to all of the PNPN switching elements of this line but different from the switching elements, that belong to different lines.

7. The two dimensional semiconductor switching device of claim 6, wherein the common region is connected to a common electrical lead.

References Cited

UNITED STATES PATENTS

| | | | |
|---|---|---|---|
| 3,303,400 | 2/1967 | Allison | 317—235 |
| 3,313,013 | 4/1967 | Last | 27—25.3 |
| 3,199,002 | 8/1965 | Martin, Jr. | 317—234 |
| 2,856,320 | 10/1958 | Swanson | 317—235 |
| 3,011,155 | 11/1961 | Dunlap | 340—165 |
| 3,034,106 | 5/1962 | Grinich | 317—235 |
| 3,218,613 | 11/1965 | Gribble et al. | 317—235 |
| 3,243,669 | 3/1966 | Sah | 317—235 |
| 3,283,170 | 11/1966 | Buie | 317—235 |

JERRY D. CRAIG, Primary Examiner

U.S. Cl. X.R.

317—235 AB, 235 D, 235 E